(12) United States Patent
Lee

(10) Patent No.: US 7,824,985 B2
(45) Date of Patent: Nov. 2, 2010

(54) METHOD FOR MANUFACTURING A RECESSED GATE TRANSISTOR

(75) Inventor: Kyu-Ok Lee, Seongdong-gu (KR)

(73) Assignee: Dongbu HiTek Co., Ltd., Seoul (KR)

( * ) Notice: Subject to any disclaimer, the term of this patent is extended or adjusted under 35 U.S.C. 154(b) by 25 days.

(21) Appl. No.: 12/344,497

(22) Filed: Dec. 27, 2008

(65) Prior Publication Data
US 2009/0197380 A1   Aug. 6, 2009

(30) Foreign Application Priority Data
Dec. 27, 2007   (KR) .................. 10-2007-0138487

(51) Int. Cl.
*H01L 21/336* (2006.01)
(52) U.S. Cl. ................ 438/270; 438/272; 438/596; 257/E21.645
(58) Field of Classification Search .......... 438/270, 438/268, 272, 274, 596; 257/E21.645
See application file for complete search history.

(56) References Cited

U.S. PATENT DOCUMENTS

| | | | | |
|---|---|---|---|---|
| 6,511,886 B2* | 1/2003 | Kim et al. | .................. | 438/270 |
| 6,657,254 B2* | 12/2003 | Hshieh et al. | ................ | 257/330 |
| 6,660,591 B2* | 12/2003 | Peake et al. | .................. | 438/270 |
| 6,916,745 B2* | 7/2005 | Herrick et al. | .............. | 438/700 |
| 7,157,324 B2* | 1/2007 | Agarwal et al. | ............. | 438/221 |
| 2001/0038121 A1* | 11/2001 | Kim et al. | .................... | 257/330 |
| 2004/0058481 A1* | 3/2004 | Xu et al. | ..................... | 438/135 |

FOREIGN PATENT DOCUMENTS

| | | |
|---|---|---|
| KR | 10-2002-0081795 | 4/2001 |
| KR | 10-2004-0002411 | 1/2004 |

* cited by examiner

*Primary Examiner*—Michael Trinh
(74) *Attorney, Agent, or Firm*—Sherr & Vaughn, PLLC

(57) ABSTRACT

A method of manufacturing a recessed gate transistor includes forming a hard mask pattern over a substrate; and then forming a trench in the substrate by performing an etching process using the hard mask pattern as an etch mask; and then performing a pullback-etching process on the hard mask pattern to expose a source region in the substrate; and then forming a gate silicon layer in the trench and over the substrate including the hard mask pattern after performing the pullback-etching process; and then performing an etch-back process on the gate silicon layer to expose the hard mask pattern such that the uppermost surface of the gate silicon layer is below the uppermost surface of the hard mask pattern; and then removing the hard mask pattern; and then simultaneously etching the gate silicon layer and the exposed portion of the substrate.

19 Claims, 10 Drawing Sheets

METHOD FOR MANUFACTURING A RECESSED GATE TRANSISTOR

The present application claims priority under 35 U.S.C. §119 to Korean Patent Application No. 10-2007-0138487 (filed on Dec. 27, 2007), which is hereby incorporated by reference in its entirety.

BACKGROUND

With increase in complexity and/or integration of semiconductor devices, a channel length of a transistor has considerably decreased. Such a decrease in channel length entails a problem of sharply lowering the threshold voltage of the transistor, a so-called "short channel effect." The short channel demands implantation of a relatively large amount of channel ions so as to maximize punch-through characteristics between a source and a drain region. In order to maximize the short channel effect, a recessed gate transistor, which has an increased channel length by forming recesses in a silicon substrate during the manufacture thereof, has recently drawn attention. This is often referred to as a "vertical trench transistor."

Figure 1:
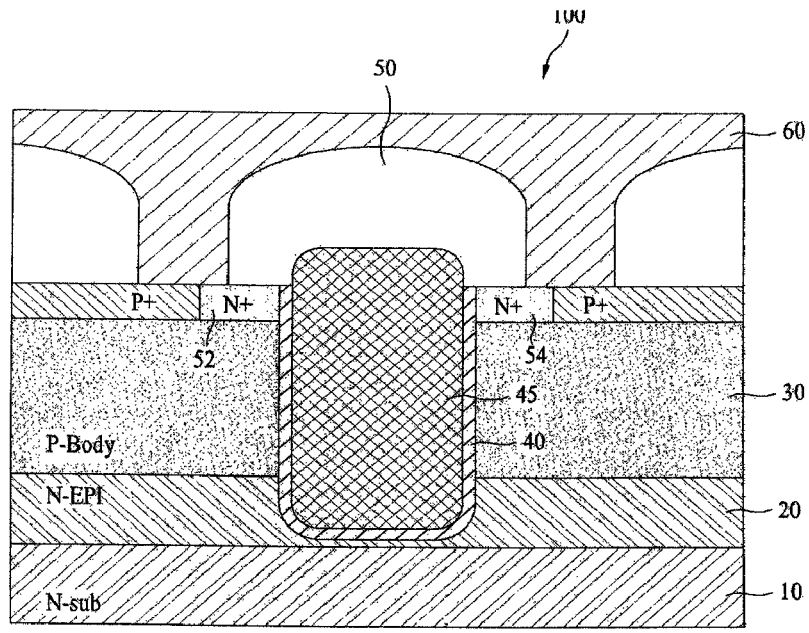

FIG. 1 is a cross-sectional view illustrating a recessed gate transistor 100. Referring to FIG. 1, the recessed gate transistor 100 includes a silicon gate 50 insulated from a main body 30 by interposing a gate oxide layer 40 therebetween, and source regions 52, 54 formed in a surface of the main body 30 at both sides of the silicon gate 50. A metal layer 60 is deposited on and/or over the silicon gate 50 to form a contact. In addition, an insulating layer 45 is added to insulate the silicon gate 50 from the metal layer 60.

If the transistor lacks overlay margin between a trench in which the silicon gate 50 is formed and the contact in the metal layer 60, gate leakage current (IGSS), i.e., a gate-source current is deteriorated when drain-source short circuit occurs by applying a specific gate voltage to the transistor. In addition, if the contact pattern exhibits misalignment or inferior uniformity of critical dimension (CD), the overlay margin must be increased. This may extend a transistor pitch, causing an increase in drain-source on-state resistance (Rds-on) of a forward biasing MOSFET.

SUMMARY

Embodiments relate to a method of manufacturing a recessed gate transistor that includes self-alignment of trench and contact patterns in a silicon gate in order to minimize overlay margin between the trench and the contact.

Embodiments relate to a method of manufacturing a recessed gate transistor that reduces on-state resistance (Rds-on) between the drain and source using safe and simplified production processes.

In accordance with embodiments, a method of manufacturing a recessed gate transistor may include at least one of the following: forming a hard mask pattern on and/or over a silicon substrate; using the hard mask pattern as an etch mask to selectively etch the silicon substrate to form a gate trench; pullback-etching the hard mask pattern to expose a source region in the silicon substrate; depositing gate silicon on and/or over the silicon substrate; etching the gate silicon; selectively removing the hard mask pattern; and then simultaneously etching both the gate silicon formed on the silicon substrate and an area from which the hard mask pattern was removed.

In accordance with embodiments, a method of manufacturing a recessed gate transistor may include at least one of the following: adding gate silicon to a surface of a source region so that the gate silicon formed on and/or over the source region can block impurity ions when the impurity ions are implanted to form a metal contact.

In accordance with embodiments, impurity ions may be implanted without a process for fabrication of an additional mask useful for forming the source, thereby simplifying production processes thereof.

In accordance with embodiments, a method of manufacturing a recessed gate transistor may include at least one of the following: forming a pullback-etched hard mask pattern to implant impurity ions so as to form a source without fabricating an additional mask pattern to form the source, thereby simplifying production processes thereof.

In accordance with embodiments, a method may include at least one of the following: forming a hard mask pattern over a substrate; and then forming a trench in the substrate by performing an etching process using the hard mask pattern as an etch mask; and then performing a pullback-etching process on the hard mask pattern to expose a source region in the substrate; and then forming a gate silicon layer in the trench and over the substrate and the hard mask pattern after performing the pullback-etching process; and then performing an etch-back process on the gate silicon layer to expose the hard mask pattern such that the uppermost surface of the gate silicon layer is below the uppermost surface of the hard mask pattern; and then removing the hard mask pattern to expose sidewalls of the gate silicon layer and a portion of the uppermost surface of the substrate; and then simultaneously etching the gate silicon layer and the exposed portion of the uppermost surface of the substrate.

In accordance with embodiments, a method may include at least one of the following: forming a hard mask pattern over a substrate; and then forming a trench in the substrate by performing an etching process using the hard mask pattern as an etch mask; and then performing a pullback-etching process on the hard mask pattern to expose a source region in the substrate; and then performing an ion implantation process on the source region to form a source and a bottom portion of the trench using the hard mask pattern as a mask after performing a pullback-etching process.

In accordance with embodiments, a method may include at least one of the following: forming a hard mask pattern over a substrate; and then simultaneously forming a first trench and a second trench spaced apart in the substrate by performing an etching process using the hard mask pattern as an etch mask; and then exposing source regions in the substrate by performing a pullback-etching process on the hard mask pattern; and then forming a polysilicon layer in the first and second trenches and over the substrate including the hard mask pattern after performing the pullback-etching process; and then performing an etch-back process on the polysilicon layer to expose the hard mask pattern such that the uppermost surface of the gate silicon layer is below the uppermost surface of the hard mask pattern; and then removing the hard mask pattern; and then simultaneously forming a first recessed poly gate, a second recessed polygate and a contact trench in an exposed portion of the substrate by etching the polysilicon layer and the exposed portion of the substrate; and then forming sources in the substrate adjacent to the second recessed polygate.

DRAWINGS

FIG. 1 illustrates a recessed gate transistor.

Example FIGS. 2 to 3 illustrate a method of manufacturing a recessed gate transistor in accordance with embodiments.

DESCRIPTION

Figure 2A:
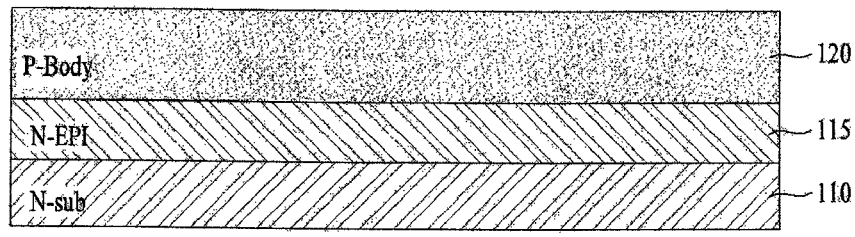
Figure 2B:
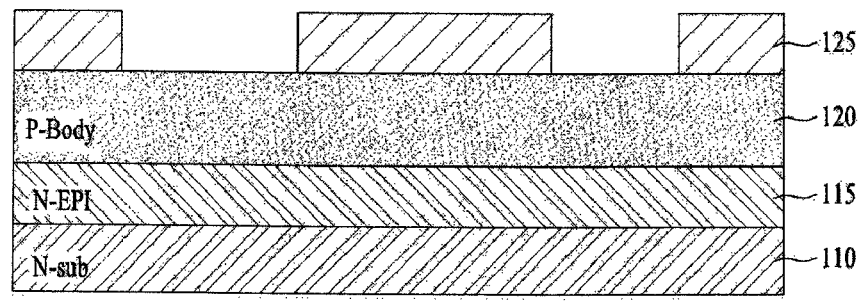
Figure 2C:
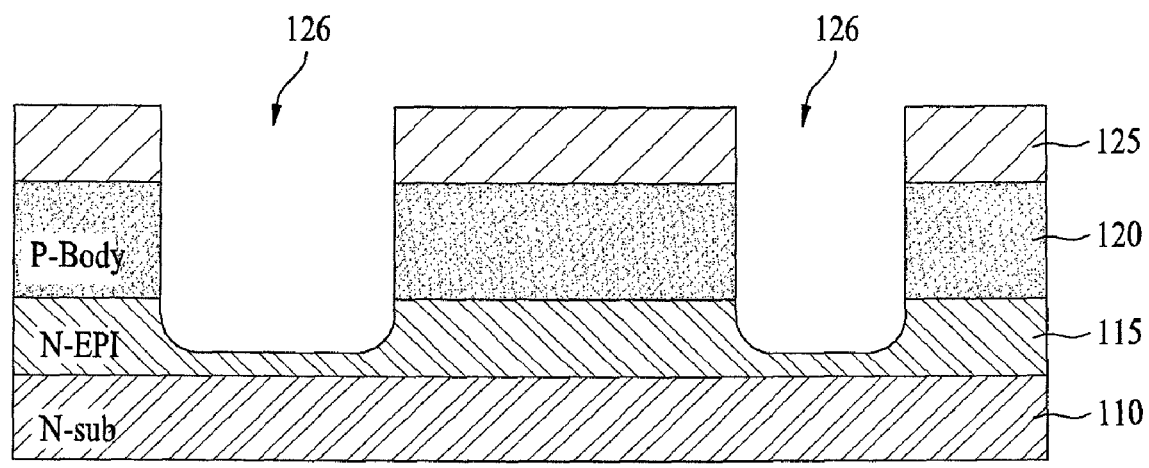
Figure 2D:
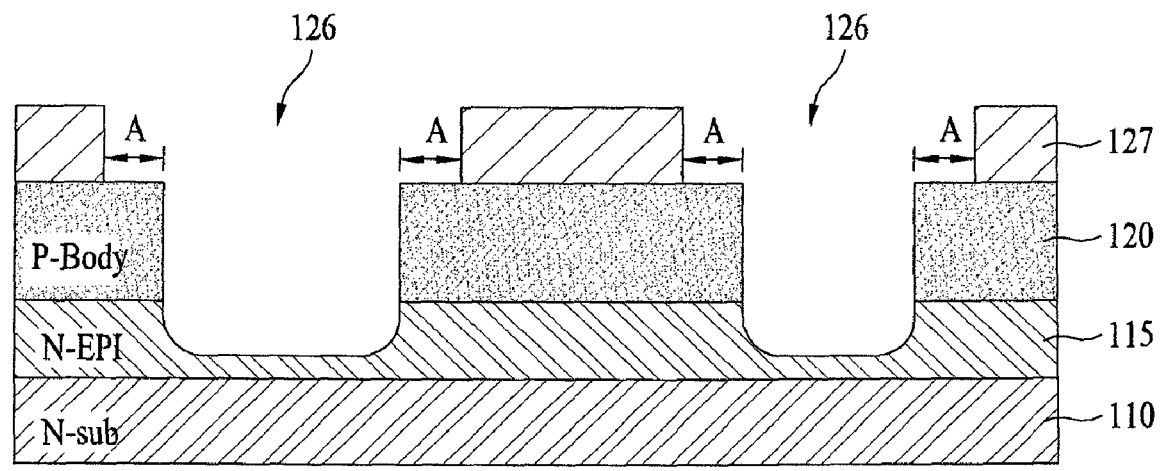
Figure 2E:
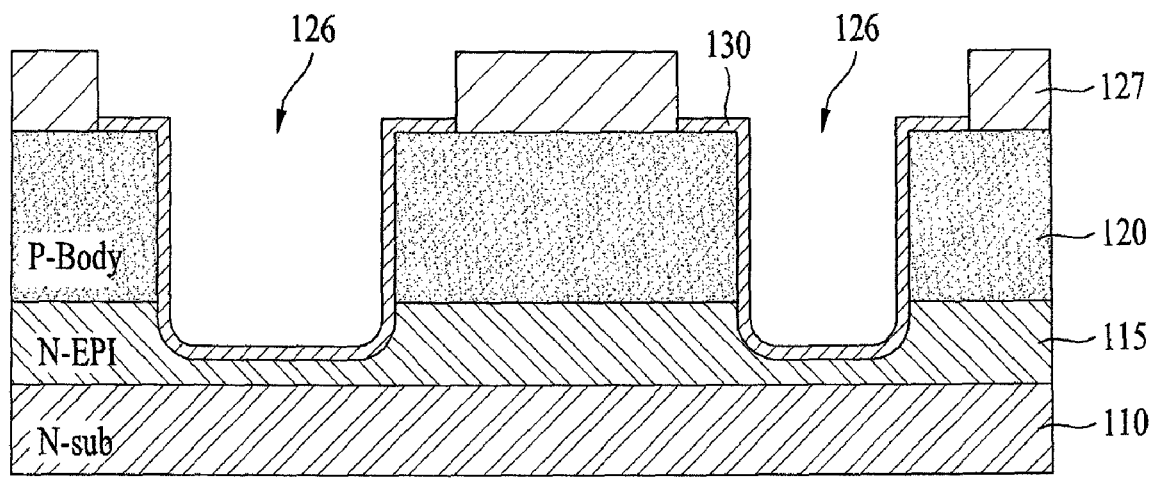
Figure 2F:
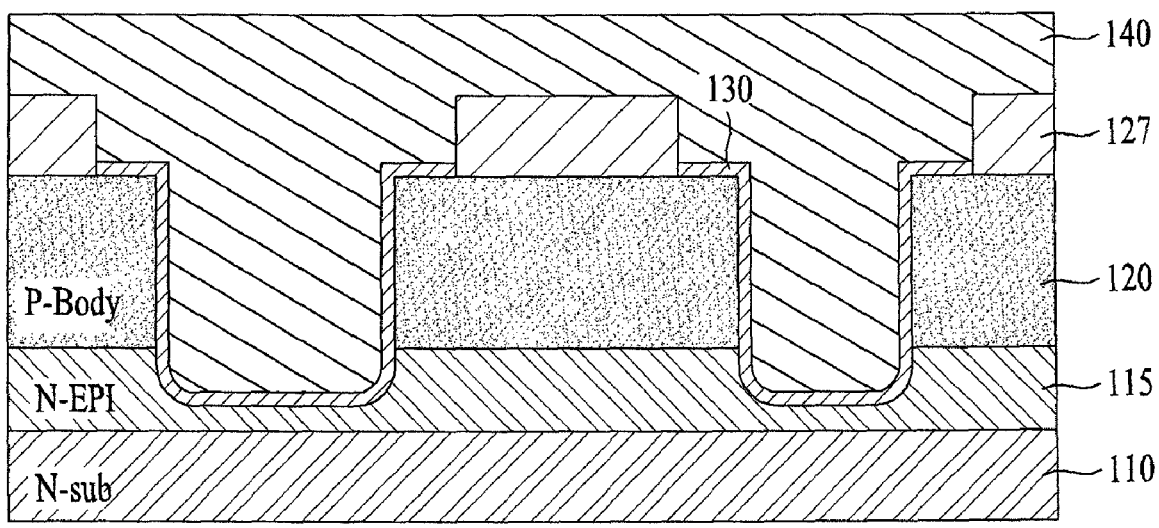
Figure 2G:
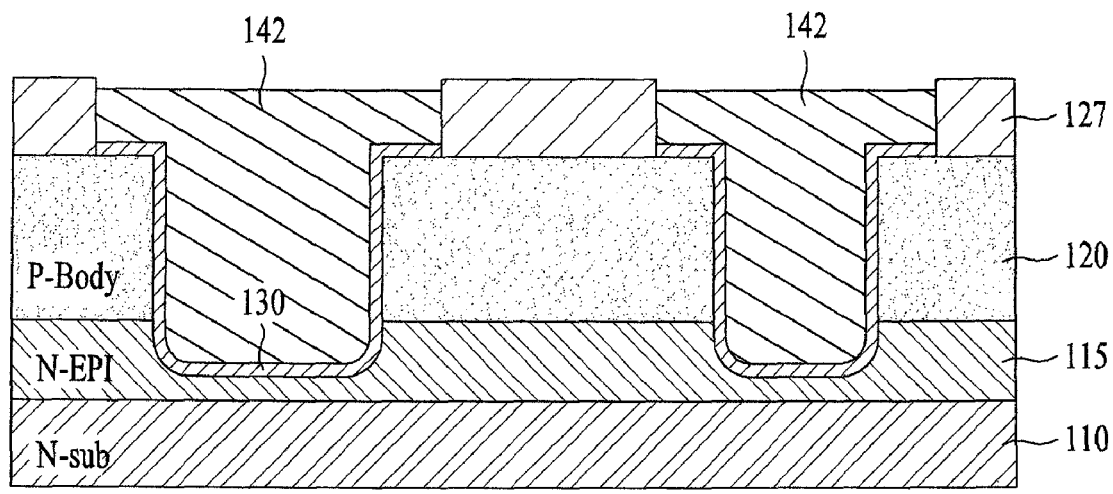
Figure 2H:
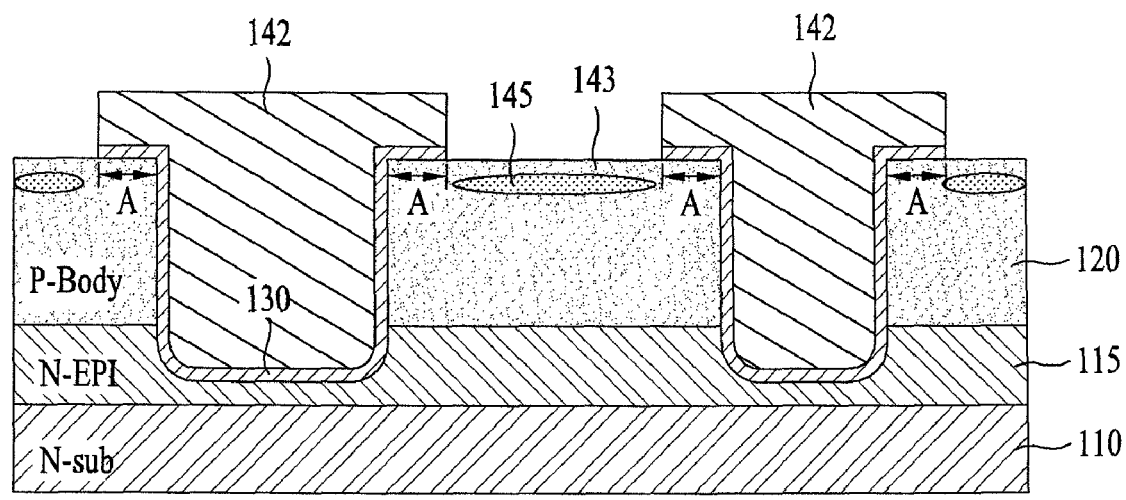
Figure 2I:
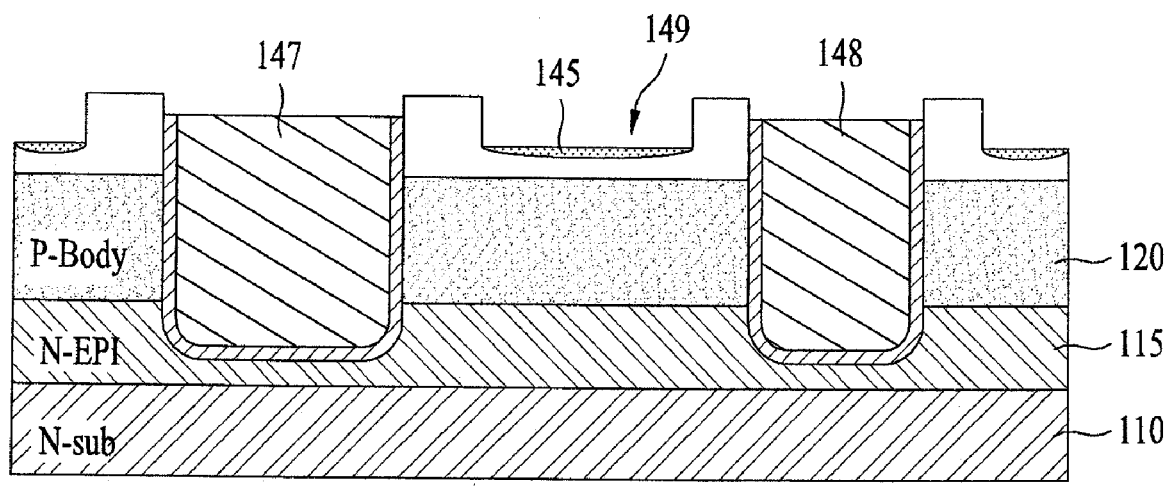
Figure 2J:
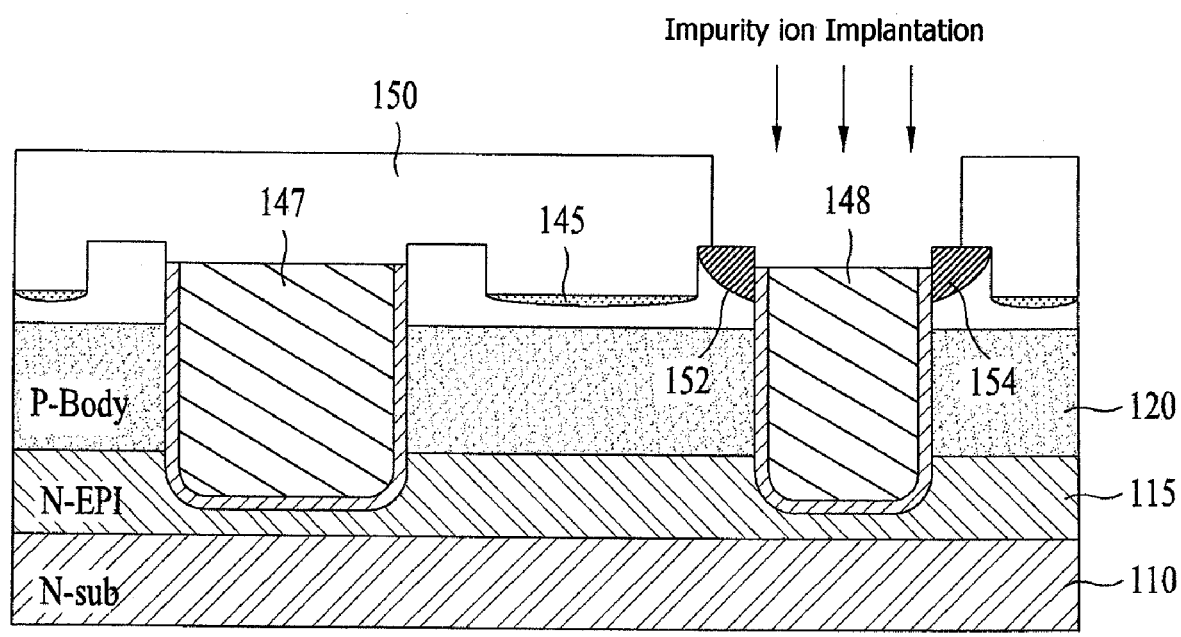
Figure 2K:
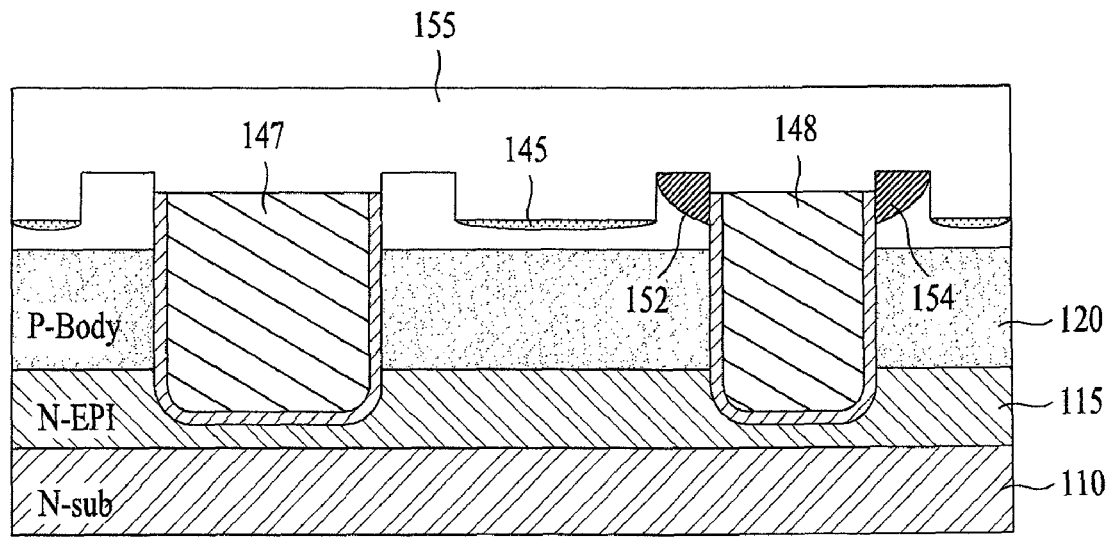
Figure 2L:
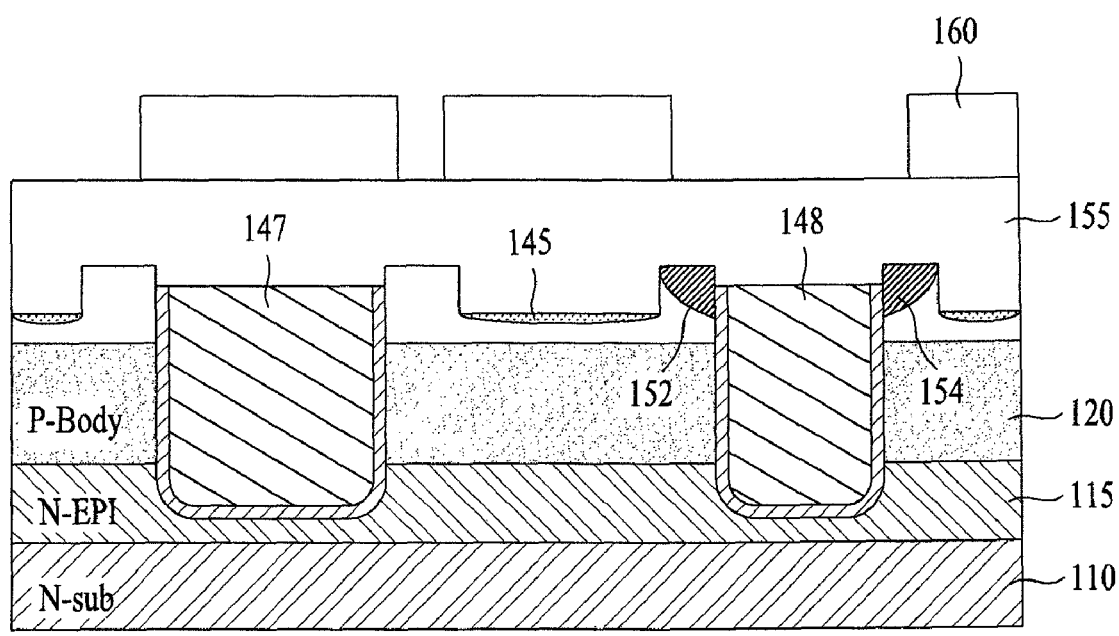
Figure 2M:
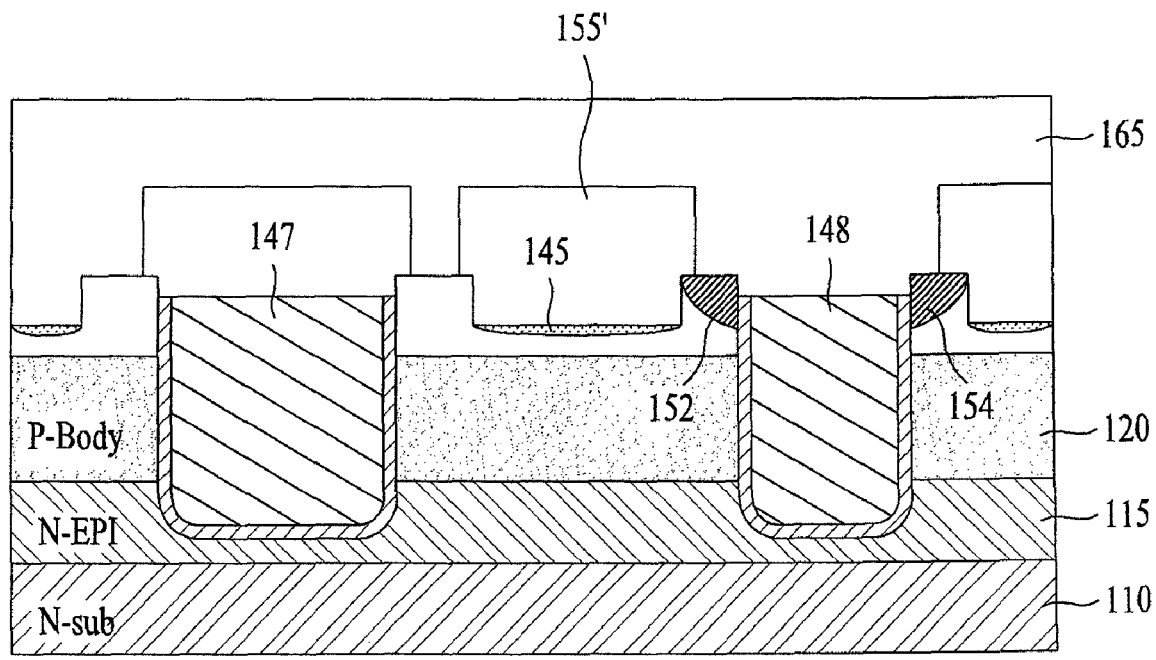
Figure 2N:
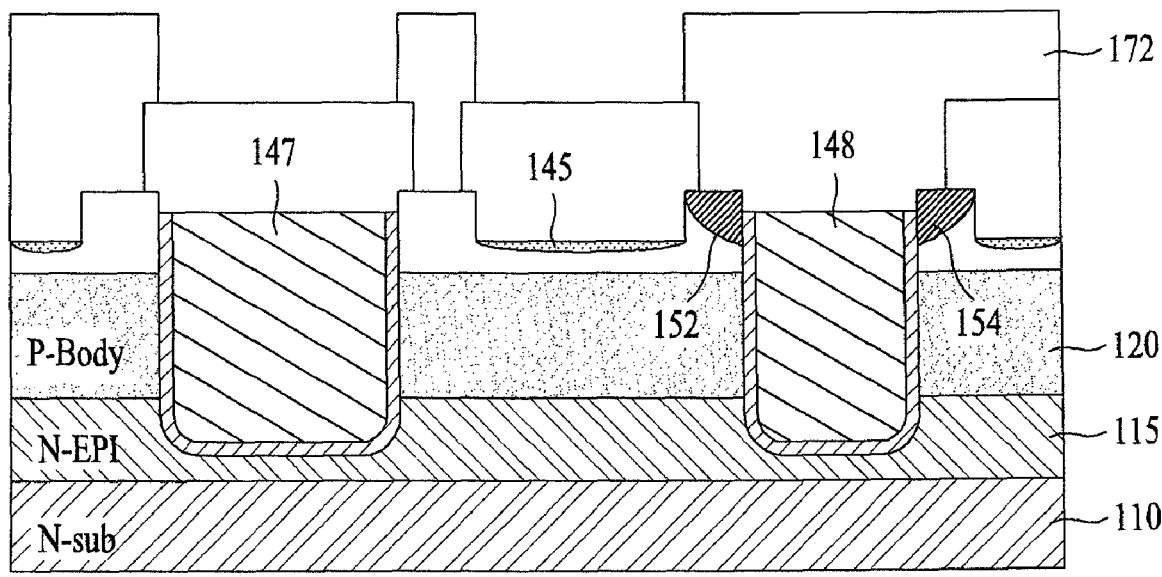

Example FIGS. 2A to 2N are cross-sectional views illustrating a method of manufacturing a recessed gate transistor in accordance with embodiments.

As illustrated in example FIG. 2A, a low concentration doped epitaxial (EPI) layer such as an N-type EPI layer 115 is formed in a high concentration doped silicon substrate such as an N-type silicon substrate 110. Next, a body such as a P-type body 120 is formed by implanting P-type impurities such as boron into the N-type silicon substrate 110. In accordance with embodiments, a process of forming the P-type body 120 may proceed after forming a gate silicon as described below.

As illustrated in example FIG. 2B, a hard mask pattern 125 which is resistant to silicon etching, is formed on and/or over the P-type body 120 to expose gate trench regions. The hard mask pattern may be composed of an oxide layer having a thickness in a range between approximately 6,500 to 8,000 Å.

As illustrated in example FIG. 2C, using the hard mask pattern 125 as an etch mask, the P-type body 120 and the N-type EPI layer 115 are selectively etched to form gate trench 126 exposing a portion of the N-type EPI layer 115. Accordingly, the etching of the N-type EPI layer 115 proceeds such that the N-type silicon substrate 110 is not exposed. The gate trench 126 formed at the left side shown in example FIG. 2 may be a BUS Gate while the gate trench 126 formed at the right side may be a Main Cell Gate. The etching may be performed by reactive ion etching.

As illustrated in example FIG. 2D, a second etching is then performed, i.e., a pullback-etching, on the hard mask pattern 125 exposing source region(s) to be formed in the P-type body 120. In accordance with embodiments, the hard mask pattern 127 may be etched at a predetermined distance A apart from the gate trench 126, at which the source region is exposed. The predetermined distance A may be in a range between approximately 0.3 to 0.4 µm.

As illustrated in example FIG. 2E, an insulating layer is then deposited on and/or over the gate trench 126 and the source region so as to form the gate oxide layer 130 in the gate trench 126 and on and/or over the exposed source region.

As illustrated in example FIG. 2F, a polysilicon layer such as a gate silicon layer 140 is then deposited on and/or over the entire substrate 110 including the gate oxide layer 130 and the etched hard mask pattern 127. The gate 140 is then subjected to impurity doping.

As illustrated in example FIG. 2G, the deposited gate silicon layer 140 is then etched by an etch-back process to expose the etched hard mask 127. In accordance with embodiments, the gate silicon layer 140 is etched such that the uppermost surface thereof is not coplanar, and particularly, is below the uppermost surface of the etched hard mask pattern 127. The etch-back process uniformly etches all parts of a subject to be etched. For example, the etch-back process may be conducted to form a gate silicon 142 having a height of 0.2 to 0.4 µm above the P-type body 120.

As illustrated in example FIG. 2H, the pullback-etched hard mask pattern 127 may then be selectively removed to expose portions 143 of the of the P-type body 120 and sidewalls of the gate silicon 142. The hard mask pattern 127 may be selectively removed by forming a photoresist pattern on and/or over the entire N-type silicon substrate 110. The photoresist pattern is then used as an etch mask to selectively etch and remove the pullback-etched hard mask pattern 127. Alternatively, a wet-etching process may be applied to selectively remove the pullback-etched hard mask pattern 127. After removing the hard mask pattern 127, the exposed portions 143 of the P-type body 120 is then subjected to impurity ion implantation. For example, high concentration N-type impurity ions may be implanted into the exposed portion 143 of the P-type body 120. As a result, the exposed portion 143 of the P-type body 120 becomes a metal contact region 143. Since a portion of the gate silicon 142 is formed on and/or over an uppermost surface of the source region A, the metal contact region 143 may be self-aligned so that an overlay margin between the gate trench 126 and the metal contact region 143 is negligible, thereby reducing cell pitch and on-state resistance between drain and source (Rds-on). Additionally, since a portion of the gate silicon 142 is formed on and/or over the uppermost surface of the source region A, the gate silicon 142 can effectively block impurity ions when the impurity ions are implanted to form a metal contact. Therefore, the impurity ion implantation may be conducted without requiring an alternative process for fabrication of an additional mask.

As illustrated in example FIG. 2I, an etch-back process is then conducted throughout the N-type silicon substrate 110 until the source region A is exposed. In accordance with embodiments, the metal contact region 143 is also etched simultaneously with the gate silicon 142. As a result of the etch-back process, a contact trench 149 is formed in the metal contact region 143. Therefore, no alternative process for forming the contact trench 149 in the metal contact region 143 is required, simplifying production processes and reducing production costs. Since the contact trench 149 is formed in the metal contact region 143, the metal contact region 143 is subjected to ion implantation in consideration of a depth of the contact trench 149 when impurity ions are implanted into the metal contact region 143 while matching the depth of the contact trench 149.

As illustrated in example FIG. 2J, a mask pattern 150 is formed through photolithography and N-type impurity ions are implanted using the formed mask pattern 150 to form source regions 152, 154. An annealing process is then performed afterwards. The mask pattern 150 may be patterned in various forms according to the source region to be formed. For example, the mask pattern 150 may be patterned to form the source regions 152, 154 at both sides of the right polygate 148.

As illustrated in example FIG. 2K, after removing the mask pattern 150, a metal layer 155 is deposited throughout the substrate by a sputtering process. At least one of a metal barrier layer and a silicide may be deposited before the metal layer 155 is formed. As illustrated in example FIG. 2L, a mask pattern 160 for metal wiring is formed on and/or over an uppermost surface of the metal layer 155 through photolithography.

As illustrated in example FIG. 2M, using the mask pattern 160 as an etch mask, the metal layer 155 is selectively etched to form a metal wiring 155'. After removing the mask pattern 160, an insulating layer 165 is deposited on and/or over the metal wiring 155'. The insulating layer 165 may include at least one of an oxide film and a nitride layer. As illustrated in example FIG. 2N, another mask pattern is formed on and/or over the insulating layer 165 through photolithography and the metal wiring 155' is exposed by performing an etching process using the mask pattern as a mask.

Example FIGS. 3A to 3F are cross-sectional views illustrating a method of manufacturing a recessed gate transistor in accordance with embodiments.

Figure 3A:
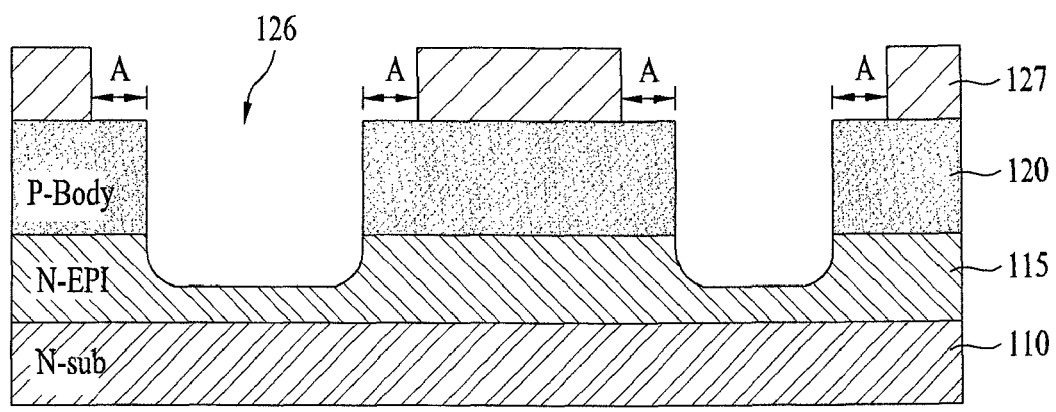

As illustrated in example FIG. 3A, the processes described above with reference to example FIGS. 2A to 2D are conducted in sequence. As a result, a mask pattern 125 is pullback-etched to expose source regions A to be formed in the P-type body 120.

Figure 3B:
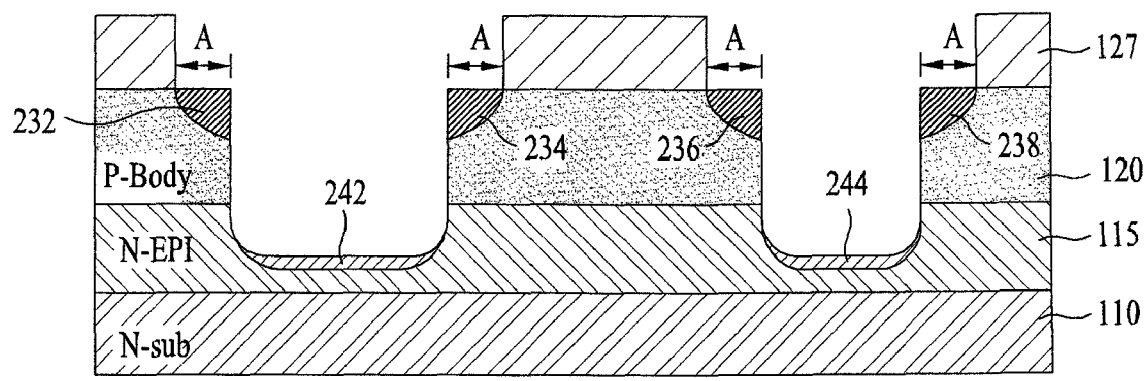

As illustrated in example FIG. 3B, using a pullback-etched hard mask pattern 127 as a mask, impurity ions such as N-type impurity ions of phosphorous (P) or arsenic (As) are selectively implanted into a bottom portion 242 of a gate trench 126 and the source regions A to form sources 232, 234, 236 and 238. Therefore, no alternative process for forming an additional mask pattern is required to form the source 232, 234, 236 and 238, simplifying production processes and reducing production costs. The sources 232, 234, 236 and 238 are formed at both sides of the gate trench 126 and, at the same time, the impurity ions are implanted into the bottom portion 242 of the gate trench 126, thus simplifying production processes. In addition, the impurity ion implantation in the bottom portion 242 of the gate trench 126 may reduce Rds-on between drain and source.

Figure 3C:
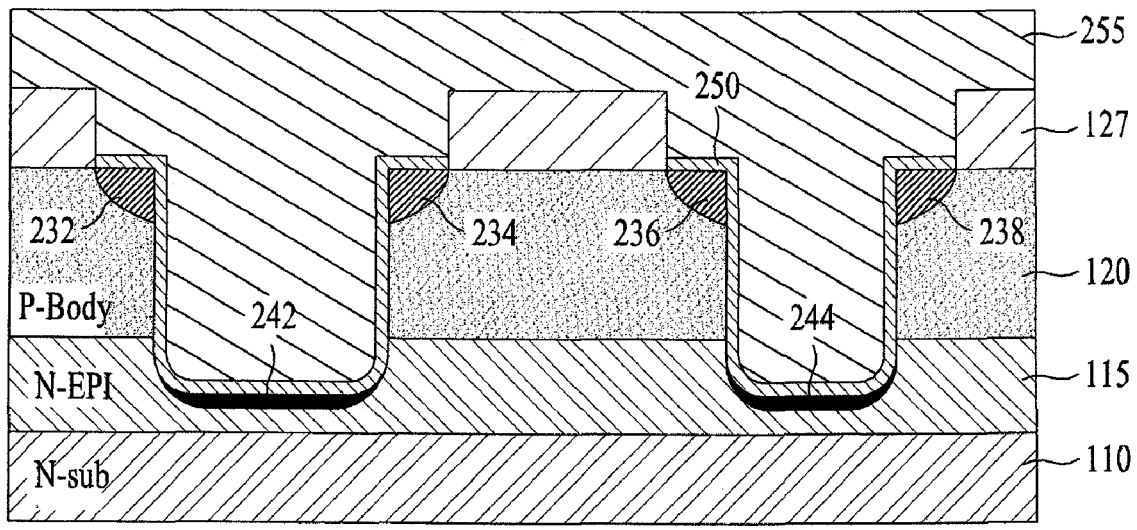
Figure 3D:
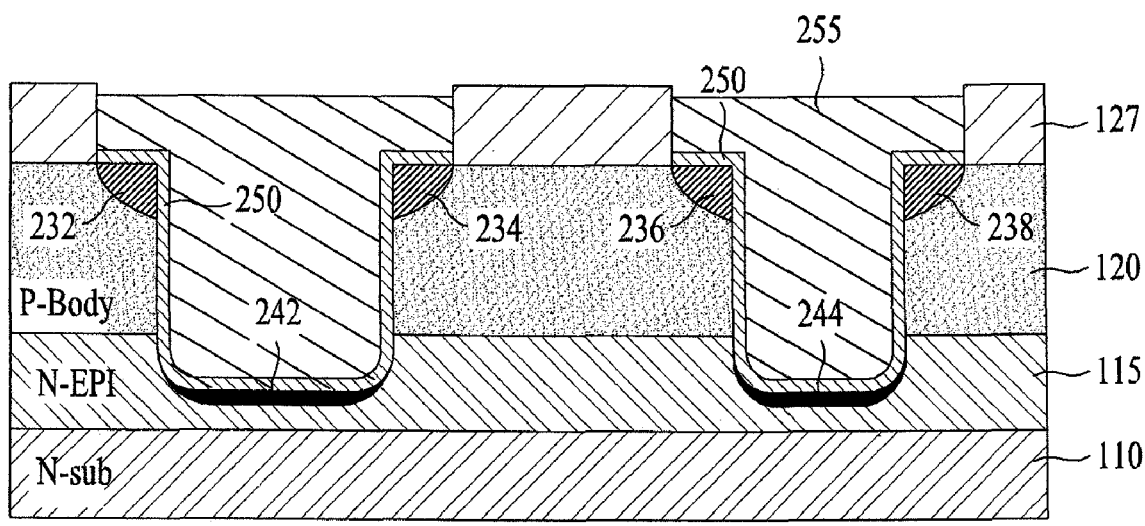

As illustrated in example FIG. 3C, a gate oxide layer 250 is formed throughout the surface of the gate trench 126 and the sources 232, 234, 236 and 238. A polysilicon layer such as a gate silicon layer 255 is then embedded in the gate trench 126 after the gate oxide layer 250 is formed. An impurity doping is then performed on the gate silicon 255. As illustrated in example FIG. 3D, the gate silicon layer 255 is then etched by an etch-back process to be etched below the etched hard mask pattern 127. In accordance with embodiments, the gate silicon layer 255 is etched such that the uppermost surface thereof is not coplanar with, and particularly, is below the uppermost surface of the etched hard mask pattern 127.

Figure 3E:
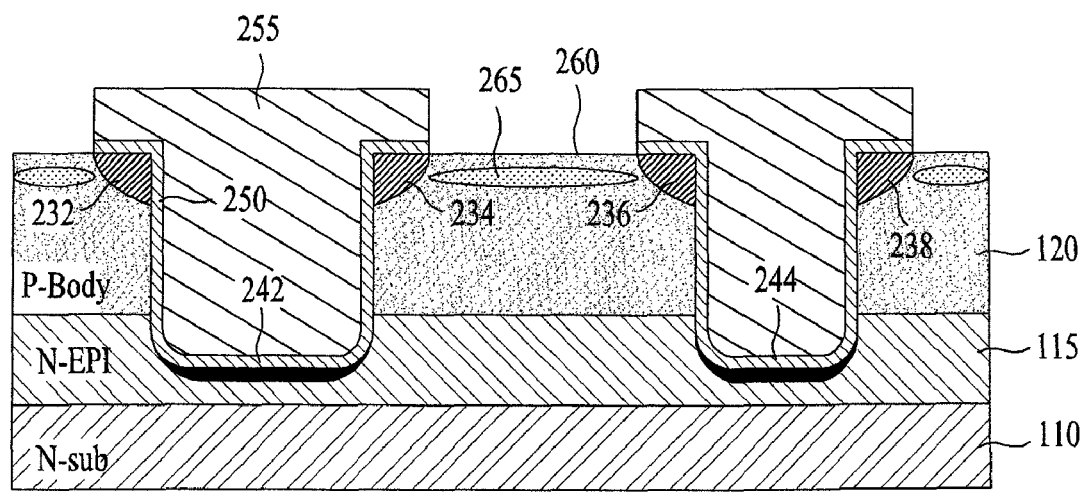
Figure 3F:
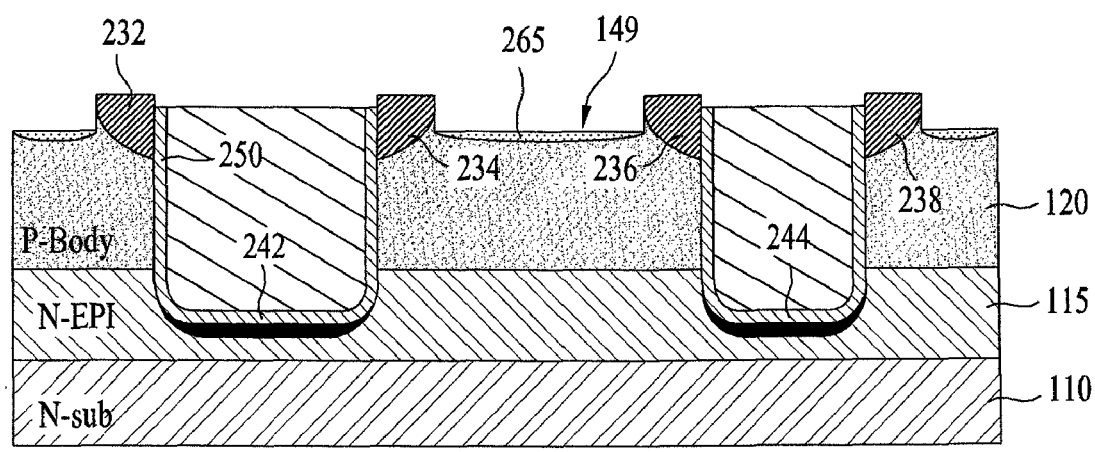

As illustrated in example FIG. 3E, the pullback-etched hard mask pattern 127 is selectively etched to expose the P-type body 260 to form a metal contact region 260. The metal contact region 260 is then subjected to impurity ion implantation. As illustrated in FIG. 3F, the etching process is conducted until the sources 232, 234, 236 and 238 are exposed. As a result, a contact trench 149 is formed in the metal contact region 260 as described above. Since the gate silicon layer 255 is formed on and/or over the sources 232, 234, 236 and 238, the metal contact region 260 may be self-aligned so that overlay margin between the gate trench and the metal contact region 260 is negligible, thus reducing cell pitch and Rds-on between drain and source. Additionally, the gate silicon layer 255 formed on and/or over the uppermost surface of the source regions 232, 234, 236 and 238 can effectively block impurity ions when the impurity ions are implanted to form the metal contact. Therefore, the impurity ion implantation may be conducted without requiring an alternative process for fabrication of an additional mask. Following this, processes for fabrication of a metal wiring may be conducted in the same way as illustrated in example FIGS. 2K to 2N.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method comprising:
   forming a hard mask pattern over a substrate; and then
   forming a trench in the substrate by performing an etching process using the hard mask pattern as an etch mask; and then
   performing a pullback-etching process on the hard mask pattern to expose a source region in the substrate; and then
   forming a gate silicon layer in the trench and over the substrate including the hard mask pattern after performing the pullback-etching process; and then
   performing an etch-back process on the gate silicon layer to expose the hard mask pattern such that the uppermost surface of the gate silicon layer is below the uppermost surface of the hard mask pattern; and then
   removing the hard mask pattern; and then
   simultaneously etching the gate silicon layer and the exposed portion of the substrate.

2. The method of claim 1, wherein the substrate is a laminate comprising an N-type epitaxial layer and a P-type body formed over the N-type epitaxial layer.

3. The method of claim 2, wherein forming a trench comprises performing the etching process to expose the N-type epitaxial layer.

4. The method of claim 1, further comprising, after performing the pullback-etching process and before forming the gate silicon layer:
   forming a gate oxide layer over the trench and the source region.

5. The method of claim 1, wherein the etch-back process is performed on the gate silicon layer such that the gate silicon layer has a first portion formed in the trench and a second portion formed above substrate including the source region.

6. The method of claim 1, wherein removing the hard mask pattern comprises:
   forming a photoresist pattern over the entire substrate; and then
   etching the hard mask pattern using the photoresist pattern as an etch mask; and then
   removing the photoresist pattern.

7. The method of claim 1, wherein removing the hard mask pattern comprises performing a wet-etching on the hard mask pattern.

8. The method of claim 5, wherein simultaneously etching the gate silicon layer and the exposed portion of the substrate comprises simultaneously forming a recessed polygate in the trench and a contact trench in the exposed portion of the substrate.

9. The method of claim 8, further comprising, after simultaneously etching the gate silicon layer and the exposed portion of the substrate:
   implanting impurity ions to form a source at the source region; and then
   performing an annealing process; and then
   forming a metal layer over the substrate, the recessed polygate and the source; and then
   forming metal wiring in the contact trench and over the recessed polygate; and then
   forming an insulating layer over the metal wiring.

10. A method comprising:
   forming a hard mask pattern over a substrate; and then
   forming a trench in the substrate by performing an etching process using the hard mask pattern as an etch mask; and then
   performing a pullback-etching process on the hard mask pattern to expose a source region in the substrate; and then
   performing an ion implantation process on the source region to form a source and a bottom portion of the trench using the hard mask pattern as a mask after performing a pullback-etching process, after performing the ion implantation process:

forming a gate oxide layer over the trench and the source; and then forming a gate silicon layer the in the trench and over the gate oxide layer and the hard mask pattern; and then performing an etch-back process on the gate silicon layer to expose the hard mask pattern such that the uppermost surface of the gate silicon layer is below the uppermost surface of the hard mask pattern; and then removing the hard mask pattern; and then simultaneously etching the gate silicon layer and the exposed portion of the substrate.

11. The method of claim 10, wherein simultaneously etching the gate silicon layer and the exposed portion of the substrate comprises simultaneously forming a recessed polygate in the trench and a contact trench in the exposed portion of the substrate.

12. The method of claim 10, wherein the substrate is a laminate comprising an N-type epitaxial layer and a P-type body formed over the N-type epitaxial layer.

13. The method of claim 12, wherein forming a trench comprises performing the etching process to expose the N-type epitaxial layer.

14. The method of claim 10, wherein said removing the hard mask pattern comprises:

forming a photoresist pattern over the entire substrate; and then etching the hard mask pattern using the photoresist pattern as an etch mask; and then removing the photoresist pattern.

15. The method of claim 10, wherein said removing the hard mask pattern comprises performing a wet-etching on the hard mask pattern.

16. A method comprising:

forming a hard mask pattern over a substrate; and then simultaneously forming a first trench and a second trench spaced apart in the substrate by performing an etching process using the hard mask pattern as an etch mask; and then exposing source regions in the substrate by performing a pullback-etching process on the hard mask pattern; and then forming a polysilicon layer in the first and second trenches and over the substrate including the hard mask pattern after performing the pullback-etching process; and then performing an etch-back process on the polysilicon layer to expose the hard mask pattern such that the uppermost surface of the gate silicon polysilicon layer is below the uppermost surface of the hard mask pattern; and then removing the hard mask pattern; and then simultaneously forming a first recessed poly gate, a second recessed polygate and a contact trench in an exposed portion of the substrate by etching the polysilicon layer and the exposed portion of the substrate; and then forming sources in the substrate adjacent to the second recessed polygate.

17. The method of claim 16, wherein the uppermost surface of the source is spatially above the uppermost surface of the second recessed polygate.

18. The method of claim 16, further comprising, forming sources in the substrate:

forming metal wiring in the contact trench and over and contacting the first recessed polygate; and then forming an insulating layer over the metal wiring.

19. The method of claim 16, wherein the first recessed polygate comprises a BUS Gate and the second recessed polygate comprises a Main Cell Gate.

* * * * *